US012620803B2

(12) United States Patent
Tiwari et al.

(10) Patent No.: US 12,620,803 B2
(45) Date of Patent: May 5, 2026

(54) FAILSAFE NODE VOLTAGE SETTING CIRCUIT

(71) Applicant: STMicroelectronics International N.V., Geneva (CH)

(72) Inventors: Manoj Kumar Tiwari, Unnao (IN); Sandeep Kaushik, Greater Noida (IN); Zia Parveen, South Delhi (IN)

(73) Assignee: STMicroelectronics International N.V., Geneva (CH)

( * ) Notice: Subject to any disclaimer, the term of this patent is extended or adjusted under 35 U.S.C. 154(b) by 85 days.

(21) Appl. No.: 18/598,920

(22) Filed: Mar. 7, 2024

(65) Prior Publication Data

US 2024/0333281 A1      Oct. 3, 2024

Related U.S. Application Data

(60) Provisional application No. 63/493,203, filed on Mar. 30, 2023.

(51) Int. Cl.
H02H 11/00      (2006.01)
H03K 17/56      (2006.01)

(52) U.S. Cl.
CPC ........... H02H 11/006 (2013.01); H03K 17/56 (2013.01)

(58) Field of Classification Search
CPC ............................ H02H 11/006; H03K 17/56
See application file for complete search history.

(56) References Cited

U.S. PATENT DOCUMENTS

| | | | | |
|---|---|---|---|---|
| 3,754,182 A | * | 8/1973 | Morris | H02H 3/243 |
| | | | | 323/299 |
| 2017/0178714 A1 | | 6/2017 | Vyavahare et al. | |
| 2019/0123543 A1 | | 4/2019 | Dubey et al. | |
| 2020/0136499 A1 | * | 4/2020 | Ou | H02M 1/08 |
| 2020/0177183 A1 | | 6/2020 | Hegde et al. | |
| 2021/0226445 A1 | | 7/2021 | Sithanandam | |
| 2022/0164517 A1 | | 5/2022 | Tang et al. | |

* cited by examiner

*Primary Examiner* — Daniel C Puentes
(74) *Attorney, Agent, or Firm* — Seed Intellectual Property Law Group LLP

(57) ABSTRACT

Provided is a circuit that sets a voltage of a failsafe node. The circuit includes a first voltage setting transistor configured to operate in a conductive state to set a voltage of the failsafe node to a supply voltage of a supply voltage node. The circuit includes first and second control transistors configured to control the first voltage setting transistor to operate in the conductive state in response to both the supply voltage and a pad node voltage of a pad node corresponding to logical one and control the first voltage setting transistor to operate in a nonconductive state in response to one of the supply voltage or the pad node voltage corresponding to the logical one and another one of the supply voltage or the pad node voltage corresponding to logical zero.

20 Claims, 1 Drawing Sheet

FAILSAFE NODE VOLTAGE SETTING CIRCUIT

BACKGROUND

Technical Field

The present disclosure is directed to a circuit that sets a voltage of a failsafe node and, in particular, a circuit that sets a voltage of a failsafe node of a buffer or a transmitter.

Description of the Related Art

In many circuits, including buffers, transmitters and input/output (I/O) drivers, normal operation conditions are predicated upon a supply voltage being provided at a particular supply voltage level. A reduction in the supply voltage, particularly to ground voltage or zero voltage, may result in operational failures of a circuit. Accordingly, the circuit may be controlled to default to a failsafe mode of operation.

BRIEF SUMMARY

Provided is a voltage setting circuit for a failsafe node. The voltage setting circuit sets the voltage of the failsafe node to the higher of a supply voltage and a pad node voltage of a pad node. The pad node may be a node over which the output signal of a device (such as a buffer, transmitter or driver, among others) is provided. The voltage of the failsafe node may be used to control the output of the device during a failsafe mode of operation. In the failsafe mode of operation, the supply voltage may correspond to a logical zero (for example, zero volts) instead of corresponding to a logical one (for example, 1.8 volts). Alternatively, the supply voltage may drop to a voltage level that is greater than zero volts but less than 1.8 volts. The pad node voltage may correspond to a normal supply voltage level (e.g., 1.8 volts) that was supplied before occurrence of the failsafe condition.

The voltage setting circuit also controls the voltage of the failsafe node when both the supply voltage and the pad node voltage correspond to a logical one and the failsafe mode of operation is in effect. The voltage setting circuit sets the voltage of the failsafe node to the supply voltage. Accordingly, the voltage setting circuit aids in avoiding or mitigating leakage current in the device as compared to setting the voltage of the failsafe node to a voltage that is less than the supply voltage.

DETAILED DESCRIPTION

Figure 1:
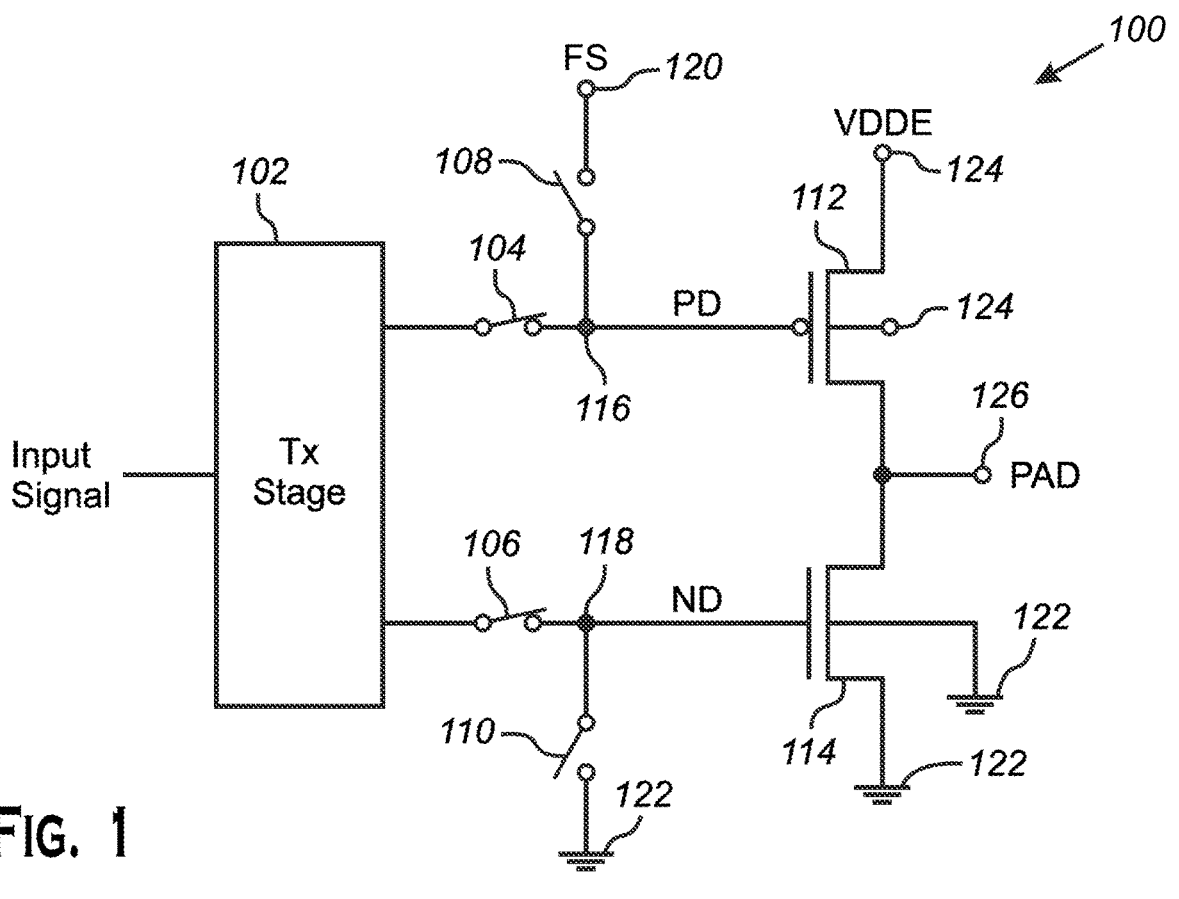
FIG. 1 shows a circuit diagram of a buffer.

FIG. 1 shows a circuit diagram of a buffer 100. Although the buffer 100 is shown as a push-pull transmitter, it is noted that any other type of buffer may be used. The buffer 100 may be an input/output (I/O) driver. The buffer 100 has failsafe functionality as described herein. The buffer 100 includes a transmitting stage 102, first and second input switches 104, 106, first and second failsafe switches 108, 110 and first and second output transistors 112, 114. The transmitting stage 102 has an input over which the transmitting stage 102 receives an input signal and first and second outputs. The buffer 100 may be part of a bidirectional buffer.

The first input switch 104 has a first conduction terminal coupled to the first output of the transmitting stage 102 and a second conduction terminal coupled to a first node 116. The second input switch 106 has a first conduction terminal coupled to the second output of the transmitting stage 102 and a second conduction terminal coupled to a second node 118. The first failsafe switch 108 has first conduction terminal coupled to a failsafe (FS) node 120 and a second conduction terminal coupled to the first node 116. The second failsafe switch 110 has a first conduction terminal coupled to the second node 118 and a second conduction terminal coupled to a reference voltage node 122. The reference voltage node 122 may be a ground node.

The first output transistor 112 has a first conduction terminal coupled to a supply voltage node 124, a second conduction terminal coupled to a pad node 126, a control terminal coupled to the first node 116 and a body terminal coupled to the supply voltage node 124. The supply voltage node 124 may be configured to provide a supply voltage (VDDE). During normal operation, the supply voltage (VDDE) may correspond to logical one or be asserted, whereby, for example, the supply voltage (VDDE) may be 1.8 volts (V). The second output transistor 114 has a first conduction terminal coupled to the pad node 126, a second conduction terminal coupled to the reference voltage node 122, a control terminal coupled to the second node 118 and a body terminal coupled to the reference voltage node 122.

During normal operation (non-failsafe mode operation), the first and second input switches 104, 106 are closed and the first and second failsafe switches 108, 110 are open. The transmitting stage 102 may be any type of logic configured to set the voltage of the first and second nodes 116, 118 based on the state of the input signal. When the input signal is asserted (e.g., logical one, activated or having a voltage level corresponding to the supply voltage (VDDE)), the transmitting stage 102 outputs a first signal, over its first output, to the first node 116 that is deasserted (e.g., logical zero, deactivated or having a voltage level corresponding to the reference voltage). In response to receiving a logical zero at its control terminal, the first output transistor 112 transitions to the conductive state thereby pulling the pad node 126 up to the supply voltage (VDDE). The buffer 100 sets the pad node 126 to the supply voltage (VDDE) to reflect the input signal.

Concurrently, the transmitting stage 102 outputs a second signal, over its second output, to the second node 118 that is also deasserted. In response to receiving a logical zero at its control terminal, the second output transistor 114 transitions to the nonconductive state thereby ensuring that the pad node 126 is decoupled from the reference voltage node 122.

When the input signal is deasserted, the transmitting stage 102 outputs asserts the first signal. In response to asserting the first signal, the first output transistor 112 operates in the nonconductive state thereby ensuring that the pad node 126 is decoupled from the supply voltage (VDDE). The transmitting stage 102 also asserts second signal. In response to asserting the second signal, the second output transistor 114 operates in the conductive state thereby pulling the pad node 126 down to the reference voltage. The buffer 100 sets the pad node 126 to the reference voltage to reflect that the input signal is logical zero.

A failsafe condition may occur when the supply voltage (VDDE) decreases or becomes zero volts (V), for example, over a period of time. The supply voltage (VDDE) may be used to indicate logical one and drive the first output transistor 112. When the supply voltage (VDDE) drops or becomes zero volts, the first output transistor 112 becomes conductive thereby creating a current flow path from the pad node 126 to the supply voltage node 124. If the pad node 126 has a higher voltage than the supply voltage node 124, then a leakage current will flow from the pad node 126 to the supply voltage node 124. For example, in the event that the pad node 126 is asserted and the supply voltage (VDDE) (used to drive the first output transistor 112) becomes 0V, then the first output transistor 112 becomes conductive thereby causing the leakage current.

To control and mitigate the leakage current, the first node 116 is decoupled from the transmitting stage 102 and coupled to the failsafe node 120 during a failsafe condition (or failsafe operation). A voltage of the failsafe node 120 is controlled to mitigate or reduce the likelihood of the occurrence of a leakage current. A voltage of the failsafe node 120 may be controlled (or set) to correspond to (or be the same as) a voltage of the pad node 126. Consequently, when the pad node 126 has a voltage corresponding to the supply voltage (VDDE), the first output transistor 112 is in a nonconductive state and the pad node 126 is decoupled from the supply voltage node 124 so as to a reduced likelihood of current leaking from the pad node 126 to the supply voltage node 124 (in the event that the supply voltage (VDDE) provided to the supply voltage node 124 drops). Conversely, when the pad node 126 has a voltage of 0V, the first output transistor 112 may be made conductive as the voltage of 0V at the pad node 126 does not allow for leakage current to occur.

During failsafe operation, the first and second input switches 104, 106 transition to the open state and the first and second failsafe switches 108, 110 transition to the closed state. For example, a controller may detect the failsafe condition and, consequently, trigger failsafe operation. The controller may be coupled to control terminals of the first and second input switches 104, 106 and the first and second failsafe switches 108, 110. In response to the triggering failsafe operation, the controller may send control signals to the first and second inputs switches 104, 106, respectively. The control signals may cause the switches 104, 106 to transition to the nonconductive state. The controller may send control signals to the first and second failsafe switches 108, 110, respectively, whereby the control signals may cause the switches 108, 110 to transition to the conductive state.

Figure 2:
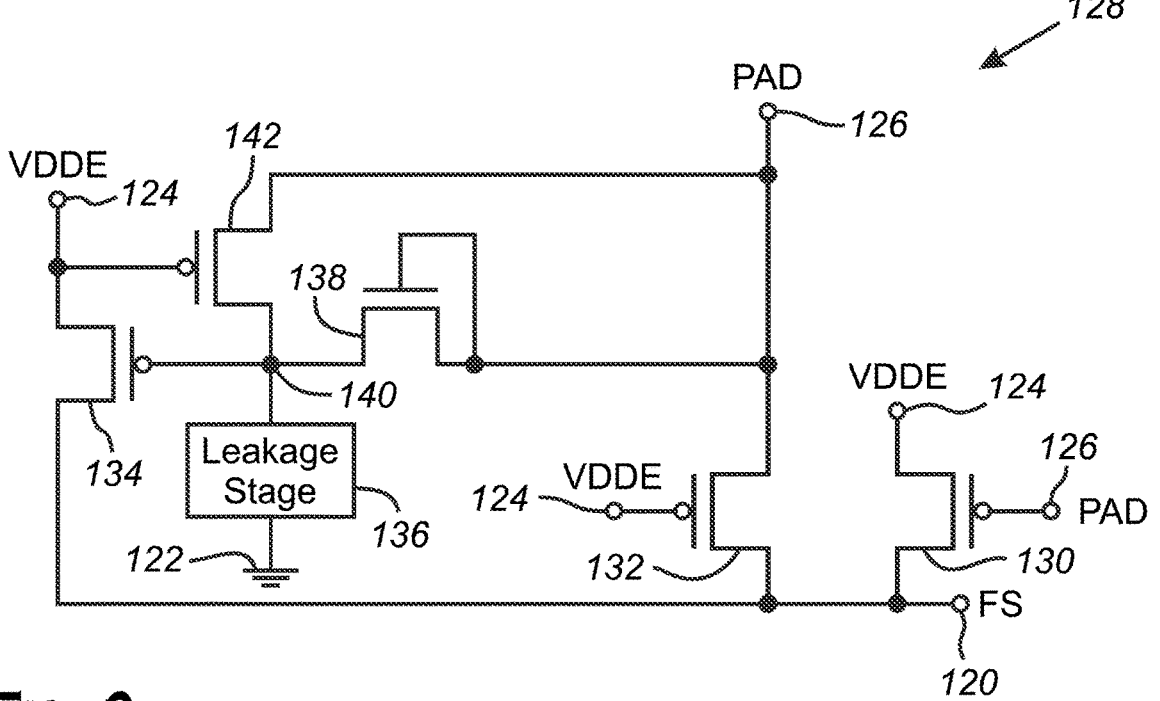
FIG. 2 shows a voltage setting circuit for a failsafe node of the buffer.

FIG. 2 shows a voltage setting circuit 128 for the failsafe node 120 of the buffer 100. The voltage setting circuit 128 includes first, second and third voltage setting transistors 130, 132, 134. The voltage setting circuit 128 also includes a leakage stage 136, a first control transistor 138, a control node 140 and a second control transistor 142.

The first voltage setting transistor 130 has a control terminal coupled to the pad node 126, a first conduction terminal coupled to the supply voltage node 124 and a second conduction terminal coupled to the failsafe node 120. The second voltage setting transistor 132 has a control terminal coupled to the supply voltage node 124, a first conduction terminal coupled to the pad node 126 and a second conduction terminal coupled to the failsafe node 120.

The third voltage setting transistors 134 has a control terminal coupled to the control node 114, a first conduction terminal coupled to the supply voltage node 124 and a second conduction terminal coupled to the failsafe node 120. The first control transistor 138 is diode-connected. The first control transistor 138 has a control terminal and a first conduction terminal that are coupled to each other and to the pad node 126. The first control transistor 138 has a second conduction terminal that is coupled to the control node 140. The second control transistor 142 has a control terminal coupled to the supply voltage node 124, a first conduction terminal coupled to the pad node 126 and a second conduction terminal coupled to the control node 140. The leakage stage 136 has an input coupled to the control node 114 and an output coupled to the reference voltage node 122. The leakage stage 136 may be a diode-connected transistor or a resistance. For example, the resistance may have a first terminal coupled to the control node 114 and a second terminal coupled to the reference voltage node 122. The diode-connected transistor of the leakage stage 136 may have a first conduction terminal coupled to the control node 140 and may have a second conduction terminal and a control terminal that are coupled to each other and also coupled to the reference voltage node 122. Alternatively or additionally, the leakage stage 136 may include a current source configured to drain low current (e.g., 1-10 nanoamperes) from the control node 140.

The first and second voltage setting transistors 130, 132 operate to set the voltage of the failsafe node 120 to the higher of the supply voltage (VDDE) and the pad node voltage. The first and second voltage setting transistors 130, 132 operate accordingly when the supply voltage node 124 and the pad node 126 have voltages representing opposite logical states or voltages having different levels.

When the pad node voltage is 0V representing logical zero and the supply voltage (VDDE) represents logical one (e.g., 1.8V), the first voltage setting transistor 130 operates in the conductive state and sets the voltage of the failsafe node 120 to the supply voltage (VDDE) representing logical one. The second voltage setting transistor 132 is nonconductive. The third voltage setting transistor 134 is also nonconductive. The third voltage setting transistor 134 has a similar configuration as the first voltage setting transistor 130. The third voltage setting transistor 134 is driven by the first and second control transistors 138, 142. The first control transistor 138 is nonconductive due to the fact that the pad node voltage is 0V, and the second control transistor 142 is also nonconductive due to the fact that the supply voltage (VDDE) represents logical one. The control node 140 is pulled down to ground by the leakage stage 136. Accordingly, like the first voltage setting transistor 130, the third voltage setting transistor 134 is driven by 0V.

Conversely, when the pad node voltage represents logical one (e.g., 1.8V) and the supply voltage (VDDE) represents logical zero (e.g., 0V), the second voltage setting transistor 132 operates in the conductive state and sets the voltage of the failsafe node 120 to the pad node voltage representing logical one, whereas the first voltage setting transistor 130 is nonconductive. The third voltage setting transistor 134 is also nonconductive. The third voltage setting transistor 134 is driven by the first and second control transistors 138, 142. The second control transistor 142 conducts because the supply voltage (VDDE) represents logical zero. The control terminal of the third voltage setting transistor 134 is pulled to logical one and causing the third voltage setting transistor 134 to be nonconductive.

Setting the voltage of the failsafe node 120 to the higher of the pad node voltage and the supply voltage (VDDE) (when the two voltages are different) aids in keeping the first output transistor 112 of the buffer 100 in the non-conductive state. The first output transistor 112 is driven by the higher of the two voltages applied to its conduction terminals.

Accordingly, a path is not available through the first output transistor 112 for leakage current.

The third voltage setting transistor 134 sets the voltage of the failsafe node 120 when both the supply voltage (VDDE) of the supply voltage node 124 and the voltage of the pad node 126 represent logical one (e.g., or have the same voltage or voltages that correspond to each other). In this case, the first and second voltage setting transistors 130, 132 are nonconductive due to the fact that they are both driven by logical one signals. The third voltage setting transistor 134 operates in the conductive state to set the voltage of the failsafe node 120 to correspond to the supply voltage (VDDE) of the supply voltage node 124.

Being diode-connected, the first control transistor 138 provides a voltage that is a function of the pad node voltage to the control node 140. The voltage of the control node 140 may be lower than the pad voltage by a threshold voltage ($V_T$) of the first control transistor 138. For example, if the pad node voltage is 1.8V and the threshold voltage ($V_T$) of the first control transistor 138 is 0.6V, then the control node 140 has a voltage of 1.2V. The third voltage setting transistor 134 is controlled by the control node 140 having a voltage of VDDE–$V_T$, whereas the first conduction terminal of the third voltage setting transistor 134 has a voltage of VDDE. Due to the difference of the threshold voltage ($V_T$) between the voltage of the first conduction terminal and the control terminal, the third voltage setting transistor 134 operates fully on and in the saturation region. The failsafe node 120 is charged to the full supply voltage (VDDE) and not a lower voltage, such as VDDE–$V_T$ in the event that the third voltage setting transistor 134 is diode-connected (and the first and second control transistors 138, 142 as well as the leakage stage 136 are forgone).

Accordingly, when the buffer 100 is operated in the failsafe operation (but under normal conditions and when both the pad node voltage and the supply voltage (VDDE) have the same voltage or represent logical one), the voltage setting circuit 128 charges the failsafe node 120 to the voltage of the pad node 126. Because the first output transistor 112 of the buffer 100 is driven by the same voltage applied to its conduction terminals, the first output transistor 112 operates in the nonconductive state and a path is not available through the first output transistor 112 for leakage current. The voltage setting circuit 128 aids in preventing the failsafe node 120 from being set to a lower voltage level (than that applied to the conduction terminals of the first output transistor 112) that would result in operating the first output transistor 112 in a conductive state.

As described herein, the second control transistor 142 ensures that in failsafe operating conditions the third voltage setting transistor 134 does not dissipate current. When the supply voltage (VDDE) falls to 0V in failsafe operating conditions, the second control transistor 142 is conductive and pulling the control node 140 to the pad node 126. When the pad node 126 represents logical one, the third voltage setting transistor 134 is nonconductive.

The leakage stage 136 aids in transitioning the voltage of the control node 140 from a voltage corresponding to logical one (e.g., 1.8V) to lower voltages, such as 1.8V–$V_T$ or 1.2V. The leakage stage 136 provides a leakage path to enable discharging the control node 140 to ground and reducing the voltage of the control node 140 per operation of the first and second control transistors 138, 142. It is noted that the transistors of the circuit 128 may be similarly or identically sized. Further, the transistors may have the n-channel metal-oxide-semiconductor field-effect transistors (nMOS) and p-channel metal-oxide-semiconductor field-effect transistors (pMOS) channel types shown in FIGS. 1 and 2 or may have different channel types.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A circuit, comprising:
   a failsafe node;
   a supply voltage node configured to provide a supply voltage;
   a pad node having a pad node voltage;
   a first voltage setting transistor configured to operate in a conductive state to set a voltage of the failsafe node to the supply voltage of the supply voltage node;
   first and second control transistors configured to:
      control the first voltage setting transistor to operate in the conductive state in response to both the supply voltage and the pad node voltage corresponding to logical one; and
      control the first voltage setting transistor to operate in a nonconductive state in response to one of the supply voltage or the pad node voltage corresponding to the logical one and another one of the supply voltage or the pad node voltage corresponding to logical zero;
   a second voltage setting transistor configured to operate in the conductive state to set the voltage of the failsafe node to the pad node voltage in response to the supply voltage corresponding to the logical zero; and
   a third voltage setting transistor configured to operate in the conductive state to set the voltage of the failsafe node to the supply voltage in response to the pad node voltage corresponding to the logical zero.

2. The circuit of claim 1, wherein the first voltage setting transistor has:
   a first conduction terminal coupled to the supply voltage node,
   a second conduction terminal coupled to the failsafe node, and
   a control terminal coupled to a control node.

3. The circuit of claim 2, wherein the first control transistor has:
   a first conduction terminal and a control terminal coupled to the pad node, and
   a second conduction terminal coupled to the control node.

4. The circuit of claim 3, wherein the second control transistor has:
   a first conduction terminal coupled to the pad node,
   a second conduction terminal coupled to the control node, and
   a control terminal coupled to the supply voltage node.

5. The circuit of claim 2, comprising:
   a leakage stage configured to drain current from the control node.

6. The circuit of claim 1, wherein:
   the second voltage setting transistor has:
      a first conduction terminal coupled to the pad node,
      a second conduction terminal coupled to the failsafe node, and a control terminal coupled to the supply voltage node, and the third voltage setting transistor has:

a first conduction terminal coupled to the supply voltage node, a second conduction terminal coupled to the failsafe node, and a control terminal coupled to the pad node.

7. A method, comprising:

controlling, by first and second control transistors, a first voltage setting transistor to operate in a conductive state in response to both a supply voltage of a supply voltage node and a pad node voltage of a pad node corresponding to logical one, wherein the second control transistor includes:

a first conduction terminal coupled to the pad node;

a second conduction terminal coupled to a control node; and a control terminal coupled to the supply voltage node;

controlling, by the first and second control transistors, the first voltage setting transistor to operate in a nonconductive state in response to one of the supply voltage or the pad node voltage corresponding to the logical one and another one of the supply voltage or the pad node voltage corresponding to logical zero; and in response to controlling the first voltage setting transistor to operate in the conductive state, setting, by the first voltage setting transistor, a voltage of a failsafe node to the supply voltage of the supply voltage node.

8. The method of claim 7, wherein the first voltage setting transistor has:

a first conduction terminal coupled to the supply voltage node, a second conduction terminal coupled to the failsafe node, and a control terminal coupled to the control node.

9. The method of claim 8, wherein the first control transistor has:

a first conduction terminal and a control terminal coupled to the pad node, and a second conduction terminal coupled to the control node.

10. The method of claim 8, comprising:

draining, by a leakage stage, current from the control node.

11. The method of claim 7, comprising:

operating, by a second voltage setting transistor, in the conductive state to set the voltage of the failsafe node to the pad node voltage in response to the supply voltage corresponding to the logical zero, and operating, by a third voltage setting transistor, in the conductive state to set the voltage of the failsafe node to the supply voltage in response to the pad node voltage corresponding to the logical zero.

12. The method of claim 11, wherein:

the second voltage setting transistor has:

a first conduction terminal coupled to the pad node, a second conduction terminal coupled to the failsafe node, and a control terminal coupled to the supply voltage node, and, the third voltage setting transistor has:

a first conduction terminal coupled to the supply voltage node, a second conduction terminal coupled to the failsafe node, and a control terminal coupled to the pad node.

13. A system, comprising:

a buffer including a pad node and configured to:

during non-failsafe operation, set a pad node voltage of the pad node based on an input signal; and during failsafe operation, set the pad node voltage based on a voltage of a failsafe node; and a circuit including:

a first voltage setting transistor configured to operate in a conductive state to set the voltage of the failsafe node to a supply voltage of a supply voltage node;

first and second control transistors configured to:

control the first voltage setting transistor to operate in the conductive state in response to both the supply voltage and the pad node voltage corresponding to logical one; and control the first voltage setting transistor to operate in a nonconductive state in response to one of the supply voltage or the pad node voltage corresponding to the logical one and another one of the supply voltage or the pad node voltage corresponding to logical zero;

a second voltage setting transistor configured to operate in the conductive state to set the voltage of the failsafe node to the pad node voltage in response to the supply voltage corresponding to the logical zero; and a third voltage setting transistor configured to operate in the conductive state to set the voltage of the failsafe node to the supply voltage in response to the pad node voltage corresponding to the logical zero.

14. The system of claim 13, wherein the first voltage setting transistor has:

a first conduction terminal coupled to the supply voltage node, a second conduction terminal coupled to the failsafe node, and a control terminal coupled to a control node.

15. The system of claim 14, wherein the first control transistor has:

a first conduction terminal and a control terminal coupled to the pad node; and a second conduction terminal coupled to the control node.

16. The system of claim 15, wherein the second control transistor has:

a first conduction terminal coupled to the pad node, a second conduction terminal coupled to the control node, and a control terminal coupled to the supply voltage node.

17. The system of claim 14, wherein the circuit includes:

a leakage stage configured to drain current from the control node.

18. The system of claim 17, wherein the leakage stage includes a first conduction terminal coupled to the control node and a second conduction terminal coupled to a reference voltage node.

19. The system of claim 18, wherein the leakage stage includes a diode-connected transistor.

20. The system of claim 13, wherein:

the second voltage setting transistor includes:

a first conduction terminal coupled to the pad node;

a second conduction terminal coupled to the failsafe node; and a control terminal coupled to the supply voltage node; and the third voltage setting transistor includes:

a first conduction terminal coupled to the supply voltage node;

a second conduction terminal coupled to the failsafe node; and a control terminal coupled to the pad node.

* * * * *